(12) United States Patent
Jang et al.

(10) Patent No.: US 6,741,191 B2
(45) Date of Patent: May 25, 2004

(54) HUFFMAN DECODING METHOD AND APPARATUS

(75) Inventors: Heung-yeop Jang, Suwon-si (KR); Tae-kyu Jang, Seoul (KR); Jong-hoon Jeong, Seoul (KR)

(73) Assignee: Samsung Electronics Co., Ltd., Kyungki-go (KR)

( * ) Notice: Subject to any disclaimer, the term of this patent is extended or adjusted under 35 U.S.C. 154(b) by 0 days.

(21) Appl. No.: 10/359,089

(22) Filed: Feb. 6, 2003

(65) Prior Publication Data

US 2003/0174076 A1 Sep. 18, 2003

(30) Foreign Application Priority Data

Feb. 28, 2002 (KR) .................. 10-2002-0010981

(51) Int. Cl.$^7$ ................................. H03M 7/40
(52) U.S. Cl. ........................ 341/65; 341/106
(58) Field of Search ............... 341/65, 67, 106

(56) References Cited

U.S. PATENT DOCUMENTS 6,636,167 B1 * 10/2003 Acharya et al. ............. 341/65

* cited by examiner

*Primary Examiner*—Brian Young
(74) *Attorney, Agent, or Firm*—Sughrue Mion, PLLC

(57) ABSTRACT

An improved Huffman decoding method and an apparatus thereof are provided. The method includes (a) obtaining index information from a first bit of a codeword formed with bits of a part of a received encoded bit stream, and accessing an entry of the look-up table corresponding to the obtained index information, and (b) determining a type of the entry based on an internal value of the accessed entry.

27 Claims, 9 Drawing Sheets

| INDEX | INTERNAL VALUE |
|---|---|
| 0 | 4 |
| 1 | N |
| 2 | 7 |
| 3 | N |
| 4 | 60 |
| 5 | N |
| 6 | 10 |
| 7 | N |
| 8 | 13 |
| 9 | 16 |
| 10 | N |
| 11 | 19 |
| 12 | 22 |
| 13 | N |
| 14 | 25 |
| 15 | N |
| 16 | 59 |
| 17 | N |
| 18 | 28 |
| 19 | N |
| 20 | 31 |

4,60,59...

| INDEX | INTERNAL VALUE |
|---|---|
| 21 | 34 |
| 22 | N |
| 23 | 37 |
| 24 | N |
| 25 | 4 |
| 26 | N |
| 27 | N |
| 28 | 61 |
| 29 | N |
| 30 | N |
| 31 | 58 |
| 32 | N |
| 33 | N |
| 34 | 62 |
| 35 | N |
| 36 | 40 |
| 37 | N |
| 38 | 43 |
| 39 | N |
| 40 | 57 |
| 41 | N |
| 42 | N |
| 43 | 63 |
| 44 | N |

FIG. 7

| INDEX | LEFT-HAND NODE:1 | RIGHT-HAND NODE:0 | INTERNAL VALUE ():NEXT BIT VALUE | RETURN VALUE |
|---|---|---|---|---|
| 0 | – | – | – | 60 |
| 1 | 2 | 3 | −1+(1) | – |
| 2 | 4 | 5 | −2+(1) | – |
| 3 | 6 | 7 | −3+(1) | – |
| 4 | – | – | – | 59 |
| 5 | 8 | 9 | −3+(1) | – |
| 6 | 10 | 11 | −4+(1) | – |
| 7 | ... | ... | ... | 4 |
| 8 | – | – | – | 61 |
| 9 | – | – | – | 58 |
| 10 | – | – | – | 62 |
| 11 | 12 | 13 | −1+(1) | – |
| 12 | – | – | – | 57 |
| 13 | – | – | – | 63 |
| ... | ... | ... | ... | ... |

| INDEX | INTERNAL VALUE |
|---|---|
| 0 | 60 |
| 1 | −1,(1) |
| 2 | −2,(1) |
| 3 | −3,(1) |
| 4 | 59 |
| 5 | −3,(1) |
| 6 | −4,(1) |
| 7 | 4 |
| 8 | 61 |
| 9 | 58 |
| 10 | 62 |
| 11 | −1+(1) |
| 12 | 57 |
| 13 | 63 |

HUFFMAN DECODING METHOD AND APPARATUS

BACKGROUND OF THE INVENTION

This application claims the priority of Korean Patent Application No. 2002-10981, filed Feb. 28, 2002, in the Korean Intellectual Property Office, the disclosure of which is incorporated herein in its entirety by reference.

1. Field of the Invention

The present invention relates to an improved Huffman decoding method and apparatus, and more particularly, to a Huffman decoding method and apparatus that performs Huffman decoding by constructing an efficient one-dimensional look-up table generated from a binary tree, and by using a numerical method for improving processing efficiency.

2. Description of the Related Art

Because of the unique characteristics of the Huffman code, the related art Huffman decoding method using a binary tree is considered a very efficient method based on maximum search time, average search time, and search time deviation. However, according to the search method based on the related art binary tree, to generate a data structure for searching, a complicated process is required for constructing a binary tree based on a linked list. Also, comparison and branch statements for transition between nodes in a binary tree search slow the processing flow of the operations of a related art processor, thereby decreasing the processing speed of a Huffman decoder.

The structure and operation of the prior art Huffman decoding apparatus and method will now be explained referring to accompanying drawings.

FIG. 1 is a schematic block diagram of the related art Huffman decoding apparatus. The apparatus comprises an input buffer 110 that receives an encoded bit stream, a search engine 120, a Huffman look-up table 130, and an output buffer 140 that outputs decoded Huffman data.

FIG. 2 is a flowchart of the prior art Huffman decoding method of a Huffman decoder based on a related art conditional branch statement. This method is performed in the apparatus shown in FIG. 1, and is described in greater detail below.

FIG. 3 is a diagram showing a binary Huffman tree structure according to the related art method. Nodes 310, 322, 330, 332, 342, 344, and 356 are internal nodes that branch to next nodes. Nodes 320, 340, 346, 350, 352, 354, 360, and 362 are terminal nodes that have return values to be actually sent back.

Table 1 is a codebook of the binary Huffman tree shown in FIG. 3.

TABLE 1

| Codeword | Value |
|---|---|
| 0 | 60 |
| 100 | 59 |
| 1010 | 61 |
| 1011 | 58 |
| 1100 | 62 |
| 11010 | 57 |
| 11011 | 63 |
| 111 | 4 |

FIGS. 4a and 4b are diagrams showing the memory structure of a Huffman table according to the related art binary tree Huffman decoding method. As shown in FIGS. 4a and 4b, the prior art Huffman table uses 3 memory spaces. As shown in FIG. 4a, for an internal node, a null value is stored in the middle memory space among the allocated 3 memory spaces, the address of a left-hand node of the children nodes is stored in the left-hand memory space, and the address of a right-hand node of the children nodes is stored in the right-hand memory space. Also as shown in FIG. 4b, for a terminal node, an internal value of the node, that is, a return value to be sent back, is stored in the middle memory space of the allocated 3 memory spaces, and null values are stored in the left-hand and right-hand memory spaces.

Referring to FIGS. 3 through 5, and based on the flowchart shown in FIG. 2, the decoding method of a Huffman decoder using the Huffman table of the prior art binary tree structure will be explained below.

In step S210, a first step of decoding, based on the codeword of an encoded bit stream input to the Huffman decoder, an entry corresponding to a root node of the Huffman tree shown in FIG. 3 (i.e., the internal node 310) is accessed. In step S220, a comparison and branch statement, it is determined whether the node corresponding to the entry accessed in the step S210 is an internal node or a terminal node.

In step S230, if it is determined in step S220 that the node corresponding to the accessed entry is a terminal node, a value stored in the middle memory space among the 3 memory spaces allocated to the terminal node is output as a decoded codeword value to be sent back. Alternatively, in step S240, if it is determined in step S220 that the node corresponding to the accessed entry is an internal node, it is determined whether the value of 1 bit input from the bit stream is '0' or '1'. If the value is '0', step S250 is performed. If the value is '1', step S260 is performed.

In step S250, an entry corresponding to an address stored in the left-hand memory space among the 3 memory spaces allocated to the current node is accessed, and step S220 is then performed. Alternatively, in step S260, an entry corresponding to an address stored in the right-hand memory space among the 3 memory spaces allocated to the current node is accessed, and step S220 is then performed.

Referring to FIGS. 2 and 5, a process for decoding an input bit stream '1110100 . . . ', which is encoded according to the prior art Huffman decoding method described above, will now be explained.

In step S210, an entry corresponding to the root address of the Huffman binary tree (the entry which corresponds to address '1' of the Huffman table shown in FIG. 5) is accessed.

In step S220, it is determined whether the node of the accessed entry is an internal node or a terminal node. Referring to FIG. 5, the value stored in the middle memory space of the 3 memory spaces of the node corresponding to address '1' is 'NULL', '4' is stored in the left-hand memory space and '7' is stored in the right-hand memory space. Accordingly, in step S220 it is determined that the node corresponding to the address '1' is an internal node shown in FIG. 4a, and accordingly, step S240 is performed.

In step S240, the first bit '1' of the first encoded codeword of the input bit stream '1110100' is input. Because the input bit (new digit( )) is '1', step S260 is performed.

In step S260, an entry corresponding to address '7' stored in the right-hand address '2' of the current address '1', that is, in the right-hand memory space of the current node, is accessed, and step S220 is performed.

In the step 220, it is determined whether the node corresponding to the address '7' of the Huffman table is an internal node or a terminal node. Referring to FIG. 5, the value stored in the middle memory space of the 3 memory spaces of the node corresponding to address '7' is 'NULL', '10' is stored in the left-hand memory space and '13' is stored in the right-hand memory space. Accordingly, in step S220 it is determined that the node corresponding to the address '7' is an internal node shown in FIG. 4a, and step S240 is performed.

In step S240, the second bit '1' of the first encoded codeword of the input bit stream '11̲10100' is input. Because the input bit (new digit( )) is '1', step S260 is performed.

In step S260, an entry corresponding to address '13' stored in the right-hand address '8' of the current address '7', that is, in the right-hand memory space of the current node, is accessed, and step S220 is performed.

In step S220, it is determined whether the node corresponding to the address '13' of the Huffman table is an internal node or a terminal node. Referring to FIG. 5, the value stored in the middle memory space of the 3 memory spaces of the node corresponding to address '13' is 'NULL', '22' is stored in the left-hand memory space and '25' is stored in the right-hand memory space. Accordingly, in step S220 it is determined that the node corresponding to the address '13' is an internal node shown in FIG. 4a, and step S240 is performed.

In step S240, the third bit '1' of the first encoded codeword of the input bit stream '111̲0100' is input. Because the input bit (new digit( )) is '1', step S260 is performed.

In step S260, an entry corresponding to address '25' stored in the right-hand address '14' of the current address '13', that is, in the right-hand memory space of the current node, is accessed, and step S220 is performed.

In step S220, it is determined whether the node corresponding to the address '25' of the Huffman table is an internal node or a terminal node. Referring to FIG. 5, the value stored in the middle memory space of the 3 memory spaces of the node corresponding to address '25' is '4', 'NULL' is stored in the left-hand memory space and 'NULL' is stored in the right-hand memory space. Accordingly, in step S220 it is determined that the node corresponding to the address '25' is a terminal node shown in FIG. 4a, and step S230 is performed.

In the step 230, the value '4' stored in the middle memory space among the 3 memory spaces allocated to the node corresponding to the address '25' is output as a decoded codeword value.

Accordingly, the decoded codeword '4' corresponding to the first codeword '111' of the input bit stream '111̲0100' is obtained, and decoding of the second codeword of the bit stream '1110100' is performed.

In the same manner as in the process for obtaining the decoded codeword value '4', in step S210 as the first step of the decoding, an entry corresponding to address '1' of the Huffman table, that is, the root address of the Huffman binary tree, is accessed and then step S220 is performed.

In step S220, it is determined whether the accessed node corresponding to the address '1' of the Huffman table is an internal node or a terminal node. The value stored in the middle memory space of the 3 memory spaces of the node corresponding to address '1' is 'NULL', '4' is stored in the left-hand memory space and '7' is stored in the right-hand memory space. Accordingly, in the step 220 it is determined that the node corresponding to the address '1' is an internal node shown in FIG. 4a, and step S240 is performed.

In step S240, the first bit '0' of the second codeword of the input bit stream '1110̲100' is input. Because the input bit (new digit( )) is '0', step S250 is performed.

In step S250, an entry corresponding to the address '4' stored in the left-hand address '0' of the current address '1', that is, the left-hand memory space of the current node, is accessed and step S220 is performed.

In step S220, it is determined whether the node corresponding to the address '4' of the Huffman table is an internal node or a terminal node. Referring to FIG. 5, the value stored in the middle memory space of the 3 memory spaces of the node corresponding to address '4' is '60', 'NULL' is stored in the left-hand memory space and 'NULL' is stored in the right-hand memory space. Accordingly, in step S220 it is determined that the node corresponding to the address '4' is a terminal node shown in FIG. 4a, and step S230 is performed.

In step S230, the value '60' stored in the middle memory space among the 3 memory spaces allocated to the node corresponding to the address '4' is output as a decoded codeword value corresponding to the second codeword '0' of the bit stream '1110100'.

In this manner, the decoded codeword value '59' corresponding to the third codeword '100' of the encoded bit stream '1110100' input to the Huffman decoder is output. By doing so, decoded codeword values '4, 60, 59, . . . ' corresponding to the bit stream '1110100 . . . ' are obtained.

The related art has various problems and disadvantages. For example, but not by way of limitation, in the related art Huffman decoding method based on a binary tree, a complicated process for generating a binary tree based on a linked list should be performed to generate a data structure needed for searching. In particular, comparison and branch statements for transition between nodes in a binary tree search reduces the processing flow of the operations of a processor such that the efficiency of the operational speed decreases. Also, since each node uses 3 memory spaces in the look-up table according to the related art Huffman decoding method, memory spaces are excessively consumed.

SUMMARY OF THE INVENTION

The present invention provides an improved Huffman decoding method by which the related art 'comparison and branch' command that decreases processing efficiency in the prior Huffman decoding process can be omitted so that the operational speed of a Huffman decoder can increase, and required memory resources can decrease.

The present invention also provides an improved Huffman decoding system which performs the improved Huffman decoding method by which the related art 'comparison and branch' command that decreases processing efficiency in the prior Huffman decoding process can be omitted, so that the operational speed of a Huffman decoder can increase, and required memory resources can decrease.

According to an aspect of the present invention, there is provided a decoding method for decoding an encoded bit stream using a look-up table comprising: (a) obtaining index information from a first bit of a codeword formed with bits of a part of the received encoded bit stream, and accessing an entry of the look-up table corresponding to the obtained index information; and (b) determining a type of the entry based on an internal value of the accessed entry.

It is preferable that in step (b) it is determined whether the entry corresponds to an internal node or a terminal node, according to the sign of the internal value of the accessed entry.

It is preferable that the decoding method further comprises: (c) when it is determined in step (b) that the accessed entry corresponds to an internal node, calculating an index value of an entry which will be accessed next, based on an index value of the current entry, the internal value of the accessed entry, and the second bit value of the codeword.

According to another aspect of the present invention, there is provided a decoding apparatus for decoding an encoded bit stream according to a binary tree search, comprising: a processor which decodes the encoded bit stream; and a memory which is connected to the processor and stores a look-up table related to the decoding, wherein the look-up table has entries which correspond to respective nodes of the binary tree and have internal values, and the type of a node of the binary tree corresponding to each entry is determined by the internal value stored in relation with the entry.

It is preferable that the internal value stored in relation with the entry has a different sign according to the type of a node corresponding to the entry.

It is preferable that if the node corresponding to the entry is an internal node, the internal value of the entry is a relative distance value between the internal node which is the current node, and a node to be accessed next.

BRIEF DESCRIPTION OF THE DRAWINGS

The above and other aspects and advantages of the present invention will become more apparent by describing in detail preferred embodiments thereof with reference to the attached drawings in which:

FIG. 5 is a Huffman table used in the related art Huffman decoding method;

FIG. 7 is a table showing a process for generating a one-dimensional look-up table according to an exemplary, non-limiting embodiment of the present invention;

FIG. 8 is a one-dimensional look-up table used in a decoding method according to an exemplary, non-limiting embodiment of the present invention.

DESCRIPTION OF THE PREFERRED EMBODIMENTS

Figure 1:
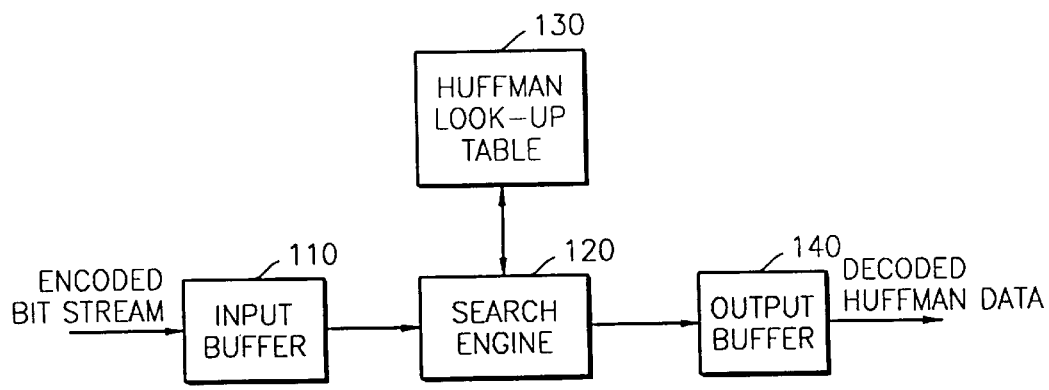
FIG. 1 is a schematic block diagram of a related art Huffman decoding apparatus.
Figure 2:
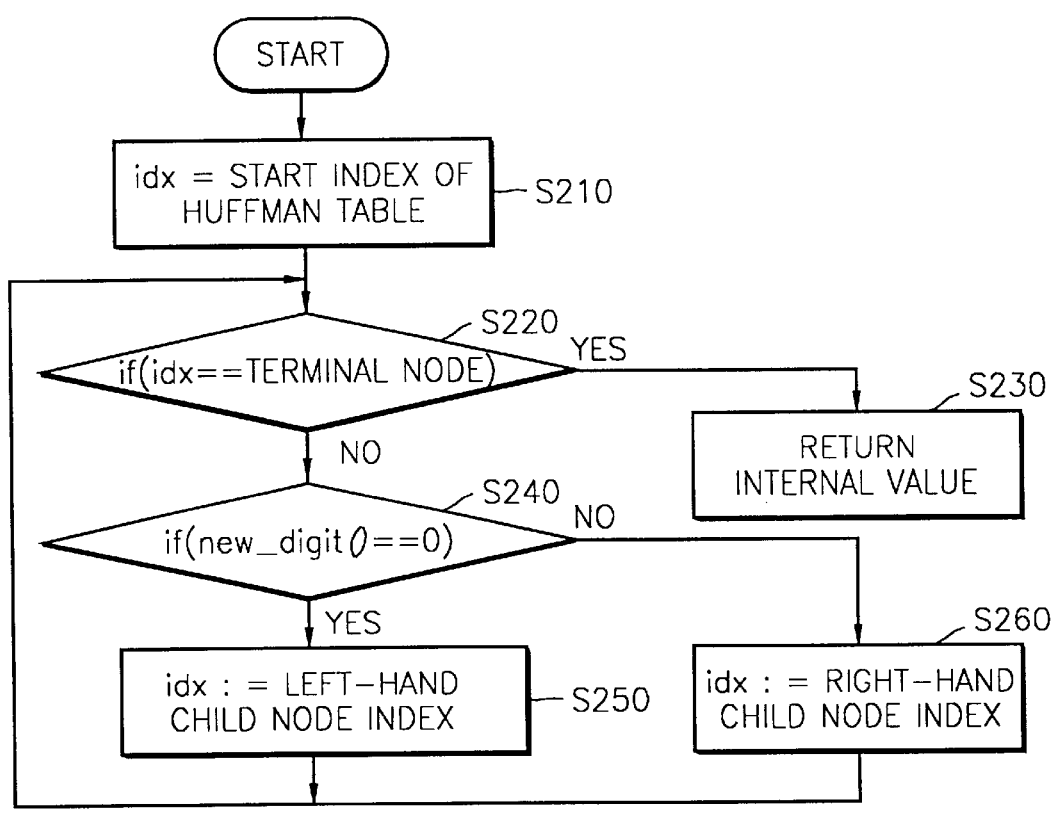
FIG. 2 is a flowchart for explaining the related art Huffman decoding method performed in the apparatus shown in FIG. 1.
Figure 3:
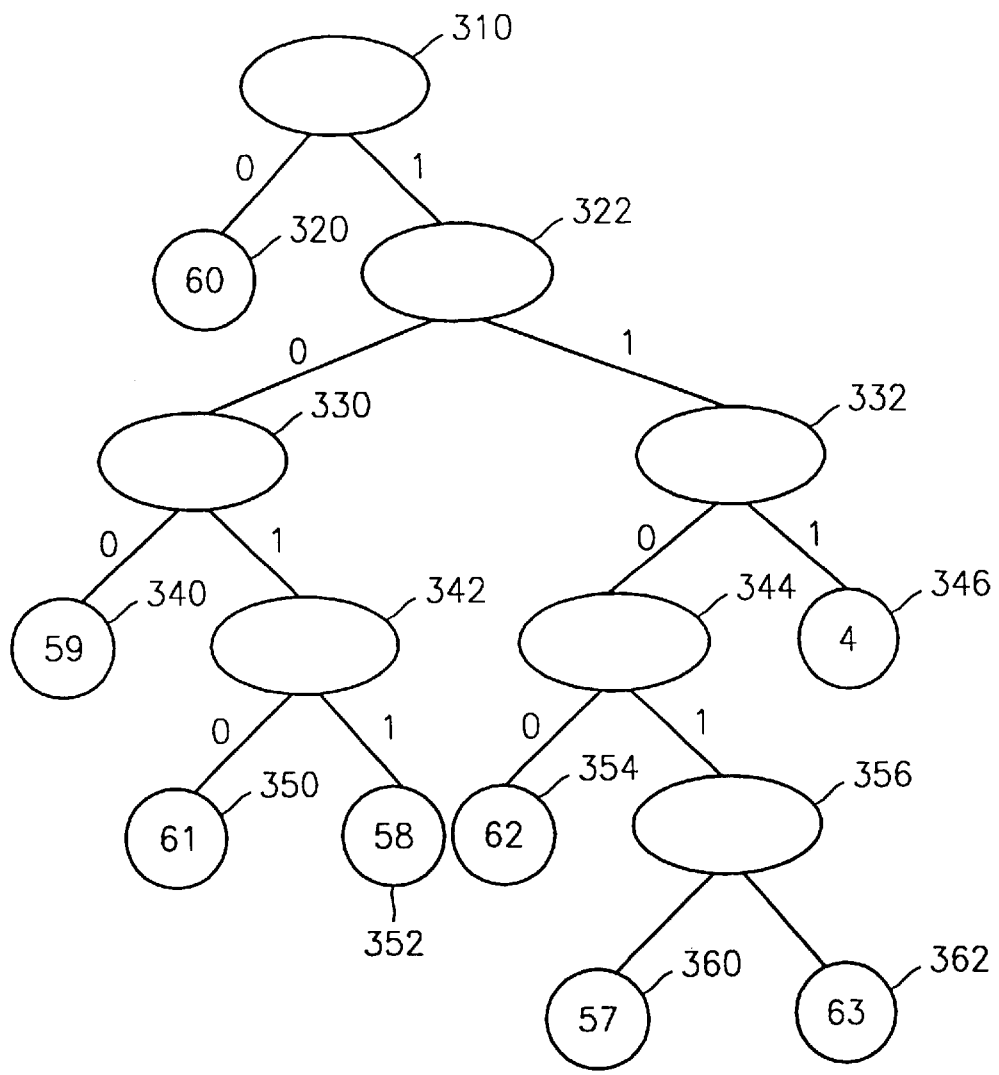
FIG. 3 is a diagram showing a binary tree structure which is used in the related art Huffman decoding method.
Figure 4A:
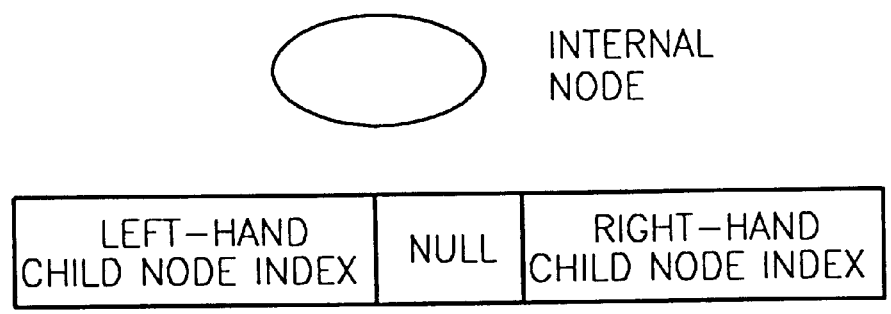
FIGS. 4a and 4b are diagrams showing memory spaces of a Huffman table, corresponding to respective nodes used in the related art Huffman decoding method.
Figure 4B:
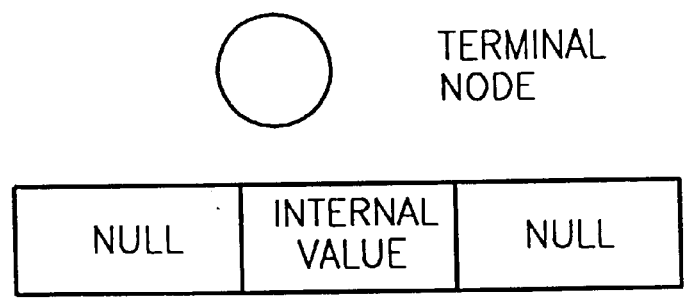
Figure 6:
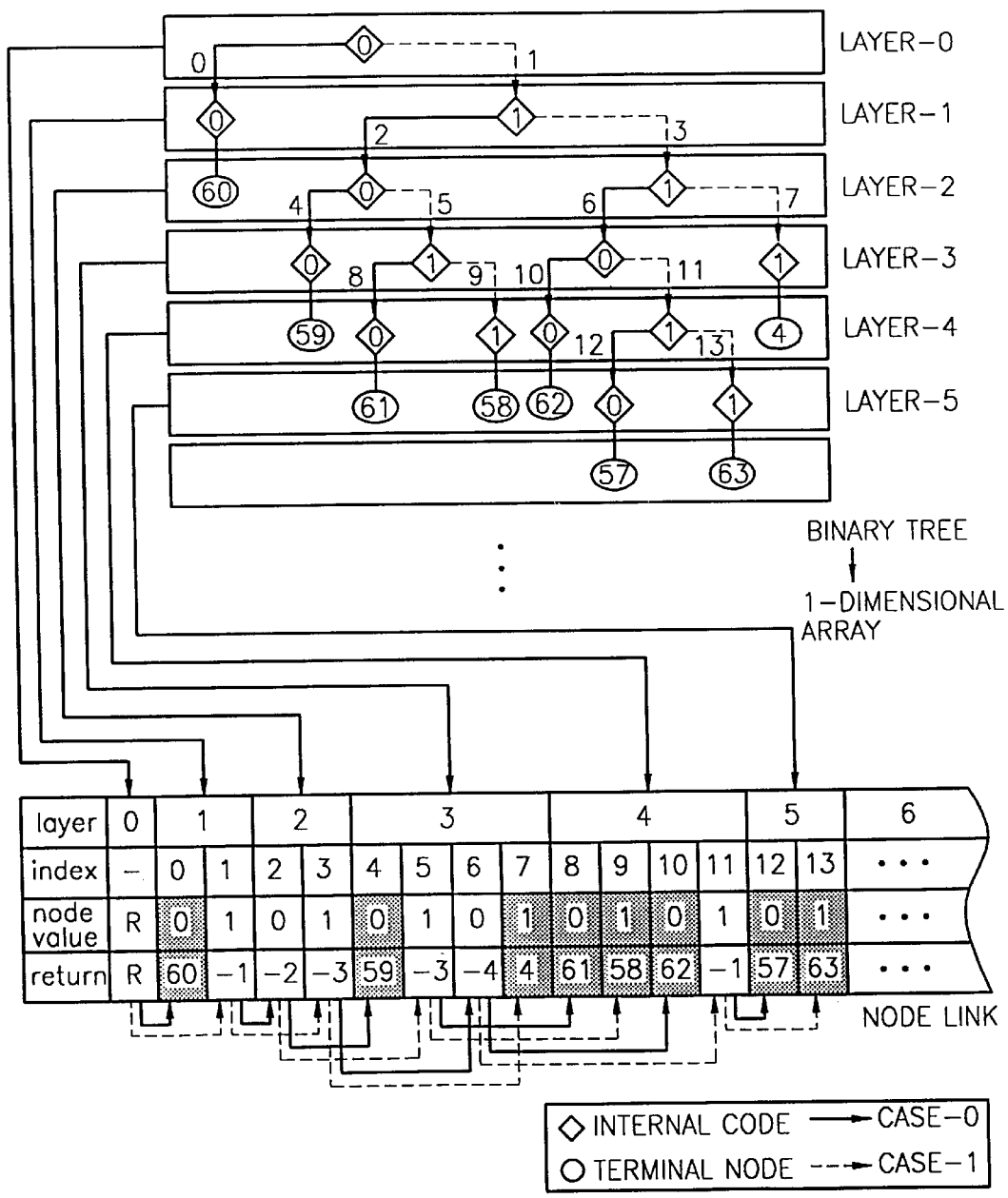
FIG. 6 is a schematic diagram showing a process for generating a one-dimensional look-up table according to an exemplary, non-limiting embodiment of the present invention.

FIG. 6 is a schematic diagram showing a process for generating an efficient one-dimensional look-up table when the look-up table is reconstructed in order to perform an improved Huffman decoding method according to an exemplary, non-limiting embodiment of the present invention. In the table converting process, the nodes of a binary tree are grouped in each identical search stage and arranged in a one-dimensional array from left to right so as to increase the size of the codewords shown in Table 1. When the look-up table shown in FIG. 6 is generated, each internal node stores a relative distance between the location of the current node and a node which will be accessed next, as an internal value, and each terminal node stores a return value that is to be actually sent back as an internal value.

The one-dimensional array generated in a sorting process has a structure of a serial static look-up table as shown in FIG. 6, without generating a dynamic data structure by a linked-list.

Referring to FIG. 6, the generation process of the one-dimensional look-up table will now be explained in more detail. Index numbers are sequentially given to respective nodes from the upper layer to the lower layer, that is, in order of layer-0, layer-1, layer-2, layer-3, layer-4, and layer-5. Also, in an identical layer, index numbers are sequentially given to respective nodes. In a preferred embodiment of the present invention, continuous index numbers are given to sibling nodes as shown in FIG. 6. Though index numbers are given from the left-hand side to the right-hand side in an identical layer in the present embodiment, the present invention is not limited thereto, as index numbers may be given from the right-hand side to the left-hand side in an identical layer.

In FIG. 6, to the terminal nodes to which index numbers 0, 4, 7, 8, 9, 10, 12, 13, . . . are given, actual return values '60', '59', '4', '61', '58', '62', '57', and '63' are allocated respectively, from the left-hand side to the right-hand side in increasing order of the size of codewords shown in table 1.

Meanwhile, in the internal nodes to which index numbers 1, 2, 3, 5, 6, 11, . . . are given, relative distance values between the current nodes and a node which will be accessed next are stored, respectively. In the internal nodes to which index numbers 1, 2, 3, 5, 6, 11 are given, the difference values of the index numbers of the current nodes and the index number of the left-hand node of children nodes, that is, '−1', '−2', '−3', '−3', '−4', and '−1', are stored, respectively.

FIG. 7 illustrates a one-dimensional look-up table constructed according to the table reconstruction method shown in FIG. 6. The reconstructed one-dimensional look-up table contains the index numbers given to respective nodes of the binary trees and the internal values of the nodes stored in relation with the index numbers. The internal value of each internal node stored in the look-up table is the relative distance value between the current node and a node which will be accessed next, that is, the difference value between the index number of the current node and the index number of the left-hand node of the children nodes in the present embodiment, and therefore is always a negative value. Meanwhile, the internal value of each terminal node is a result value which will be sent back, that is, a return value, and therefore is a positive value.

Though in the present embodiment, each internal node has a difference value between the index number of the current node and the index number of the left-hand node of the children nodes, the present invention is not limited thereto, as other relative distance values, such as the difference value from the index number of the right-hand node, may be stored selectively in other embodiments.

Figure 8:
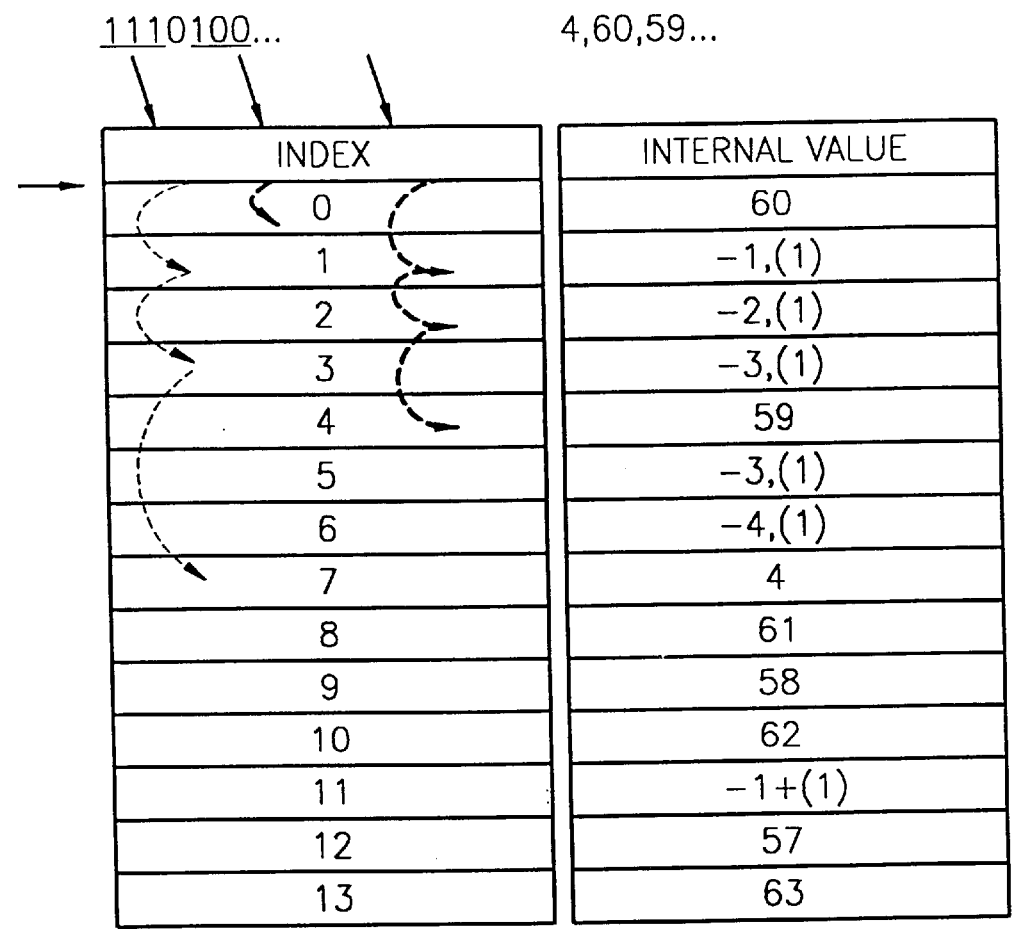

The columns named 'Left-hand node: 0' and 'Right-hand node: 1' in the one-dimensional look-up table shown in FIG. 7 are not included in the final look-up table shown in FIG. 8, and show an intermediate process for generating a table.

These columns indicate search address values which will be accessed next in a search process. Together with 1 bit data read from an encoded bit stream, each item in these columns indicates the index number of a node in a search stage for moving to a next node.

The related art binary tree Huffman look-up table should have 3 elements for each node, including a data value of the node and address values for moving to a next node when branch to the left-hand node or the right-hand node is performed. Accordingly, 3 memory spaces are needed for each node of the binary tree.

In contrast, in the final look-up table according to an exemplary, non-limiting embodiment of the present invention shown in FIG. 8, each internal node has only a relative distance value between the current node and a node which will be accessed next, and each terminal node has only a result value which will be sent back, that is, a return value. Also, each of these two values as indicated by thick lines in FIG. 7 occurs always exclusively. Therefore, each of them can be arranged in a one-dimensional space as shown in FIG. 8. Accordingly, compared to the related art look-up table, needed memory space is reduced by at least a third.

Figure 9:
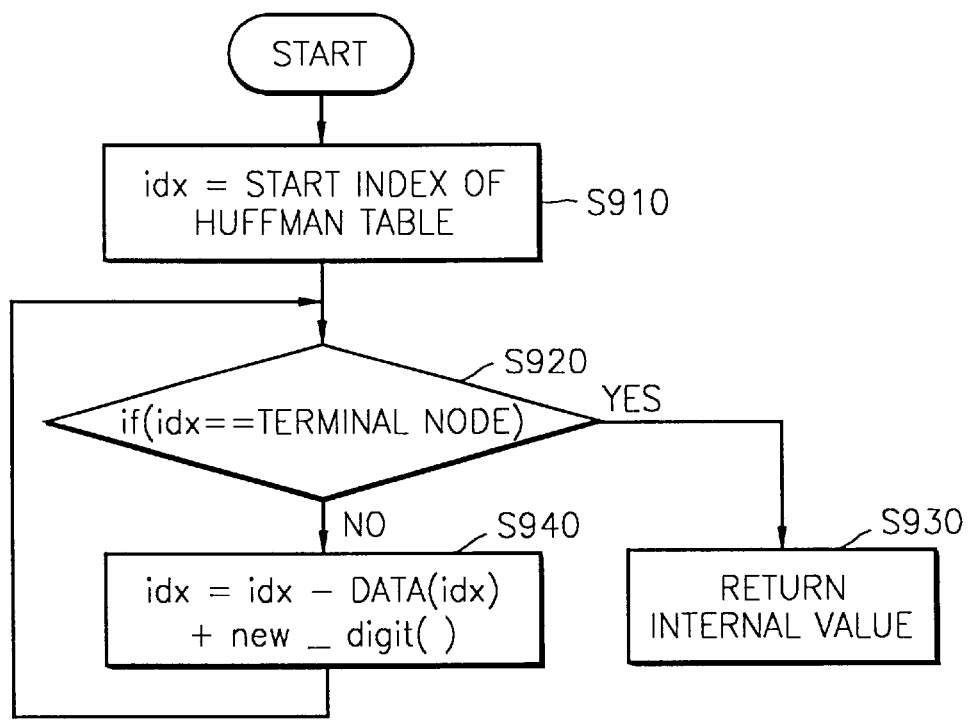
FIG. 9 is a flowchart for explaining an improved Huffman decoding method based on numerical operations, according to an exemplary, non-limiting embodiment of the present invention.

FIG. 9 is a flowchart for explaining an improved Huffman decoding method using the one-dimensional look-up table according to an embodiment of the present invention shown in FIG. 8. In step S910 as the first step of decoding using the one-dimensional look-up table, an entry of the look-up table of FIG. 8 is accessed by using the first bit value of a predetermined codeword of an encoded bit stream which is input to the Huffman decoder, as index information.

In step S920, it is determined whether a current node corresponding to the entry accessed in step S910 is an internal node or a terminal node. In the present embodiment, the type of a node is determined according to whether the internal value of a corresponding entry is a positive value or a negative value.

In step S920, if the internal value stored in the corresponding entry is a positive value, it is determined that the current node is a terminal node, and step S930 is performed. If the internal value is a negative value, it is determined that the current node is an internal node, and step S940 is performed.

When it is determined in step S920 that the current node is a terminal node, the internal value of the current node is output as a return value which will be actually sent back, in step S930. However, when it is determined in step S920 that the current node is an internal node, a new index value is calculated according to the following equation 1 in step S940, and an entry in the look-up table corresponding to the calculated index value is accessed:

$$index=index-data(index)+new\_digit(\ ) \qquad (1)$$

In the equation 1, index in the right side denotes the index number of a current node, data(index) denotes a relative distance value between the current node stored as an internal value in the current entry and a node which will be accessed next, and new_digit( ) denotes a next bit value. The relative distance value is the difference value between the index number of the current node and the index number of the left-hand node of the children nodes of the current node.

Referring to the one-dimensional look-up table according to the present invention shown in FIG. 8 and the flowchart shown in FIG. 9, an exemplary, non-limiting process for decoding '1110100' in an encoded bit stream which is input to the Huffman decoder will now be explained.

In step S910 as the first step of decoding, an entry of the look-up table of FIG. 8 is accessed by using the first bit '1' of the first codeword of an encoded bit stream '<u>1</u>110100' which is input to the Huffman decoder, as index information. Here, it is assumed that a codeword corresponding to a predetermined return value begins from the first bit of the bit stream '1110100'.

In step S920, it is determined whether a current node is an internal node or a terminal node, based on the sign of the internal value of a node corresponding to the current entry accessed in step S910, that is, the entry having the index value 1 of the look-up table of FIG. 8. In the present embodiment, since the internal value of the entry having the index value 1 is a negative value '−1' in the step 920, it is determined that the current node is an internal node, and step S940 is performed.

In step S940, a new index value is calculated by equation 1 and a new entry is accessed according to the calculated index value, and then the step 920 is performed. In the present embodiment, data(index) is the result value of index number 1–2, and new_digit( ) is the next bit value '1' in the bit stream '1<u>1</u>10100' desired to be decoded. Accordingly, the new index value is index=1−(−1)+1=3.

Therefore, in step S940, an entry corresponding to index 3 is accessed and then step S920 is performed. In step S920, it is determined whether a node of the current entry accessed in step S940, that is, the entry corresponding to index 3 of the look-up table of FIG. 8, is an internal node or a terminal node. In the step 920, since the internal value of the entry is a negative value '−3', it is determined that the current node is an internal node, and step S940 is performed again.

In step S940, according to equation 1, a new index value is calculated. Since new_digit( ) is the second bit value '1' of the first codeword in the bit stream '11<u>1</u>0100' desired to be decoded, the new index value is index=3−(−3)+1=7.

Therefore, an entry corresponding to index 7 is accessed and then step S920 is performed. In step S920, it is determined whether a node of the current entry accessed in step S940, that is, the entry corresponding to index 7 of the look-up table of FIG. 8, is an internal node or a terminal node. In step S920, since the internal value of the entry is a positive value, it is determined that the current node is a terminal node, and step S930 is performed.

In step S930, the internal value '4' of the entry corresponding to index 7 is output as a result value which will be sent back, that is, a decoded codeword. By doing so, the decoding steps for the first bit set in the encoded bit steam '<u>111</u>0100', that is, the codeword '111', are finished, and then decoding for a second codeword begins.

In step S910, an entry of the look-up table of FIG. 8 is accessed by using the first bit '0' of the second codeword of the bit stream '1110100'. In step S920, since the internal value of the entry corresponding to index 0 accessed in step S910 is a positive value, it is determined that the current node is a terminal node and step S930 is performed (the internal value is returned).

In step S930, the internal value '60' of the entry corresponding to index 0 is output as a decoded codeword. By doing so, the decoding steps for the second codeword '0' in the encoded bit steam '111<u>0</u>100', are finished, and then decoding for a third codeword begins.

In step S910, an entry of the look-up table of FIG. 8 is accessed by using the first bit '1' of the third codeword of the bit stream '1110<u>1</u>00'. In step S920, since the internal value of the current entry accessed in step S910, that is, the entry corresponding to index 1, is a negative value '−1', it is determined that the current node is an internal node and step S940 is performed.

In step S940, according to the equation 1, a new index value is calculated. Since new_digit( ) is the next bit value '0' in the bit stream '111010 0' desired to be decoded, the new index value is index=1−(−1)+0=2. Therefore, an entry corresponding to index 2 is accessed, and step S920 is performed.

In step S920, it is determined whether a node of the current entry accessed in step S940, that is, the entry corresponding to index 2 of the look-up table of FIG. 8, is an internal node or a terminal node. In the present embodiment, since the internal value of the current entry is a negative value '−2', it is determined that the current node is an internal node, and step S940 is performed.

In step S940, according to the equation 1, a new index value is calculated. Since new_digit( ) is the second bit value '0' of the third codeword in the bit stream '1110100' desired to be decoded, the new index value is index=2−(−2)+0=4 according to the equation 1. Therefore, an entry corresponding to index 4 is accessed and then step S920 is performed.

In step S920, it is determined whether a node of the current entry accessed in step S940, that is, the entry corresponding to index 4 of the look-up table of FIG. 8, is an internal node or a terminal node. In step S920, since the internal value of the current entry is a positive value '59', it is determined that the current node is a terminal node, and step S930 is performed.

In step S930, the internal value '59' of the current entry is output as a decoded codeword of the third codeword '100' of the encoded bit stream '1110100'. Thus, decoding for 3 codewords in the encoded bit stream '1110100' is performed and decoded codewords '4, 60, 59' are output as result values.

Therefore, when the process for performing the Huffman decoding method based on the related art binary tree is compared with the process for performing the improved Huffman decoding method according to the exemplary, non-limiting present embodiment, it is shown that the Huffman decoding method applies 1 data bit which is input from the encoded bit stream, directly to the access of an entry of the look-up table, that is, to calculations of address values so that conditional statements, which are needed for transition between nodes in the related art Huffman decoding method, can be removed. Accordingly, the Huffman decoding method according to the present invention achieves more improved processing efficiency.

Table 2 shows the performance results of the improved Huffman decoding method according to the present invention and the Huffman decoding method by the related art sequential search method.

TABLE 2

| Huffman codebook | Search stage/table size | Total search frequency | Average search frequency | | Improvement of search speed (%) |
| --- | --- | --- | --- | --- | --- |
| | | | Proposed search method | Sequential search method | |
| Scale factor | 19/121 | 14022 | 3.91 | 5.09 | 30.01 |
| 1 | 16/81 | 5624 | 4.52 | 12.50 | 177.98 |
| 2 | 16/81 | 7857 | 5.39 | 18.61 | 245.11 |
| 3 | 16/81 | 16710 | 3.77 | 6.46 | 71.11 |
| 4 | 16/81 | 8680 | 4.77 | 11.42 | 139.32 |
| 5 | 16/81 | 28794 | 3.08 | 4.51 | 46.35 |
| 6 | 16/81 | 1086 | 5.17 | 14.04 | 172.58 |
| 7 | 16/64 | 2958 | 2.64 | 3.29 | 24.80 |
| 8 | 16/64 | 582 | 4.81 | 11.13 | 131.28 |
| 9 | 16/169 | 234 | 2.94 | 5.09 | 73.26 |

TABLE 2-continued

| Huffman codebook | Search stage/table size | Total search frequency | Average search frequency | | Improvement of search speed (%) |
| --- | --- | --- | --- | --- | --- |
| | | | Proposed search method | Sequential search method | |
| 10 | 16/169 | 2594 | 6.51 | 33.60 | 415.63 |
| 11 | 16/289 | 7640 | 7.41 | 65.02 | 776.43 |

As shown in the performance results of Table 2, when an arbitrary MPEG-2 advanced audio coding (AAC) test files were tested, performance improvement was achieved by a minimum of about 24% to a maximum of about 777% according to the types of Huffman codebooks. Also, from the viewpoint of average search frequency, the Huffman decoding method according to the present embodiment showed about 75% performance improvement compared with the Huffman decoder using an ordinary sequential search method.

Table 3 shows the test results of the methods by using 6 different MPEG-2 AAC files under the same measuring environments.

TABLE 3

| | Total search frequency | | |
| --- | --- | --- | --- |
| Test file | Proposed search method | Sequential search method | Improvement of search speed (%) |
| test01.aac | 407,591 | 1,168,714 | 187 |
| test02.aac | 404,608 | 1,238,404 | 206 |
| test03.aac | 360,727 | 1,236,965 | 243 |
| test04.aac | 371,423 | 941,376 | 153 |
| test05.aac | 174,997 | 511,710 | 192 |
| test06.aac | 239,362 | 740,700 | 209 |
| Average | 326,451 | 972,978 | 198 |

As shown in Table 3, the improved Huffman decoding method according to the present embodiment improves the search speed by a minimum of about 153% and a maximum of about 243% according to the types of file, compared with the Huffman decoding method of the related art sequential search method.

The present invention is not limited to the preferred embodiments described above, and it is apparent that variations and modifications by those skilled in the art can be effected within the spirit and scope of the present invention as defined in the appended claims.

Also, the present invention may be embodied in a code, which can be read by a computer, on a computer readable recording medium. The computer readable recording medium includes all kinds of recording apparatuses on which computer readable data are stored.

The computer readable recording media includes (but is not limited to) storage media such as magnetic storage media (e.g., ROM's, floppy disks, hard disks, etc.), optically readable media (e.g., CD-ROMs, DVDs, etc.), and carrier waves (e.g., transmissions over the Internet). Also, the computer readable recording media can be transmitted to computer systems connected through a network, and it can store and execute a computer readable code in a distributed mode.

According the improved Huffman decoding method and apparatus of the present invention as described above, 'comparison and branch' operations needed in the prior art binary tree search are removed, thereby increasing the search speed. Also, a look-up table can be implemented with a memory space which is only a third of the memory space of the prior art table that is used for the 'comparison and branch' statements. Additionally, the encoded bit stream may be encoded by one of the motion pictures experts group (MPEG) standard, the joint photographic coding experts group (JPEG) standard, and the H.26x standard.

What is claimed is:

1. A method for decoding a received encoded bit stream using a look-up table, the method comprising:
   (a) obtaining index information from a first bit of a codeword formed with bits of a part of the received encoded bit stream, and accessing an entry of the look-up table corresponding to the obtained index information; and
   (b) determining a type of the entry based on an internal value of the accessed entry.

2. The method of claim 1, wherein in step (b) it is determined whether the entry corresponds to an internal node or a terminal node, according to a sign of the internal value of the accessed entry.

3. The method of any one of claims 1 and 2, further comprising:
   (c) when it is determined in step (b) that the accessed entry corresponds to an internal node, calculating an index value of an entry to be accessed subsequently, based on an index value of the current entry, the internal value of the accessed entry, and the second bit value of the codeword.

4. The method of claim 3, wherein the index value to be accessed subsequently is calculated according to the following equation:

$$index_a = index_b - data(index) + new\_digit(\ ),$$

wherein $index_b$ denotes the index number of the current entry, data(index) denotes a return value of the current entry, and new_digit( ) denotes a next bit value in the codeword, and further comprising a step for accessing an entry of the look-up table corresponding to the calculated index value.

5. The method of claim 3, wherein the internal value of the current entry is a relative distance between the current node and a node which to be accessed subsequently.

6. The method of claim 3, wherein the entry to be accessed subsequently corresponds to a left-hand node of children nodes of the current node, and the relative distance is a difference between the index value of the current entry and the index value of the entry corresponding to the left-hand node.

7. The method of claim 3, further comprising:
   when it is determined in step (b) that the accessed entry corresponds to an internal node, accessing an entry of the look-up table, based on a value obtained by adding the index value of the accessed entry, the absolute value of the internal value, and the next bit value of the codeword.

8. The method of any one of claims 1 and 2, further comprising:
   (d) when it is determined in step (b) that the accessed entry corresponds to a terminal node, outputting the internal value of the look-up table as a decoded codeword of a codeword formed with bits of a part of the encoded bit stream.

9. The method of claim 3, wherein step (b) further comprises:
   (b1) determining whether the accessed entry corresponds to an internal node or a terminal node, using the calculated index and based on an internal value of an entry of the look-up table corresponding to the index.

10. The method of claim 9, wherein step (b) further comprises:
    (b2) when it is determined that the node of the entry is a terminal node, outputting the internal value of the look-up table as a decoded codeword of a predetermined encoded codeword of the encoded bit stream.

11. The method of claim 1, wherein the encoded bit stream is encoded by one of the motion pictures experts group (MPEG) standard, the joint photographic coding experts group (JPEG) standard, and the H.26x standard.

12. The method of claim 1, wherein the look-up table is generated from a binary tree.

13. An apparatus for decoding an encoded bit stream according to a binary tree search, comprising:
    a processor which decodes the encoded bit stream; and
    a memory coupled to the processor, said memory storing a look-up table related to the decoding,
    wherein the look-up table has entries which correspond to respective nodes of the binary tree and have internal values, and the type of one of the nodes of the binary tree corresponding to each one of the entries is determined by the internal value stored in relation with the entry.

14. The apparatus of claim 13, wherein the internal value stored in relation with the entry has a different sign according to a type of a node corresponding to the entry.

15. The apparatus of any one of claims 13 and 14, wherein if the node corresponding to the entry is an internal node, the internal value of the entry is a relative distance value between the internal node which is the current node, and a node to be accessed next.

16. The apparatus of claim 15, wherein the entry to be accessed next for obtaining the internal value of the current entry is an entry corresponding to a left-hand node of children nodes of a node corresponding to the current entry, and the relative distance is a difference value between the index value of the current entry and the index value of an entry corresponding to the left-hand node.

17. The apparatus of any one of claims 13 and 14, wherein if the entry corresponds to a terminal node, the internal value of the entry is a decoded codeword of a predetermined codeword of the bit stream.

18. The apparatus of claim 13, wherein the encoded bit stream is encoded by one of the motion pictures experts group (MPEG) standard, the joint photographic coding experts group (JPEG) standard, and the H.26x standard.

19. The method of claim 4, wherein the internal value of the current entry is a relative distance between the current node and a node which to be accessed subsequently.

20. The method of claim 4, wherein the entry to be accessed subsequently corresponds to a left-hand node of children nodes of the current node, and the relative distance is a difference between the index value of the current entry and the index value of the entry corresponding to the left-hand node.

21. A computer-readable medium containing a set of instructions, said instructions comprising the steps of:
    (a) obtaining index information from a first bit of a codeword formed with bits of a part of the received encoded bit stream, and accessing an entry of the look-up table corresponding to the obtained index information; and (b) determining a type of the entry based on an internal value of the accessed entry.

22. The computer-readable medium of claim 21, wherein in step (b) it is determined whether the entry corresponds to an internal node or a terminal node, according to a sign of the internal value of the accessed entry.

23. The computer-readable medium of claims 21, further comprising:

(c) when it is determined in step (b) that the accessed entry corresponds to an internal node, calculating an index value of an entry to be accessed subsequently, based on an index value of the current entry, the internal value of the accessed entry, and the second bit value of the codeword.

24. The computer-readable medium of claim 23, further comprising:

when it is determined in step (b) that the accessed entry corresponds to an internal node, accessing an entry of the look-up table, based on a value obtained by adding the index value of the accessed entry, the absolute value of the internal value, and the next bit value of the codeword.

25. The computer-readable medium of claim 23, further comprising:

(d) when it is determined in step (b) that the accessed entry corresponds to a terminal node, outputting the internal value of the look-up table as a decoded codeword of a codeword formed with bits of a part of the encoded bit stream.

26. The computer-readable medium of claim 23, wherein step (b) further comprises:

(b1) determining whether the accessed entry corresponds to an internal node or a terminal node, using the calculated index and based on an internal value of an entry of the look-up table corresponding to the index.

27. The computer-readable medium of claim 26, wherein step (b) further comprises:

(b2) when it is determined that the node of the entry is a terminal node, outputting the internal value of the look-up table as a decoded codeword of a predetermined encoded codeword of the encoded bit stream.

* * * * *